(12) United States Patent
Tang

(10) Patent No.: US 10,181,567 B2
(45) Date of Patent: Jan. 15, 2019

(54) DOUBLE-SIDED OLED DISPLAY DEVICE

(71) Applicant: WUHAN CHINA STAR OPTOELECTRONICS TECHNOLOGY CO., LTD., Hubei (CN)

(72) Inventor: Yuejun Tang, Hubei (CN)

(73) Assignee: WUHAN CHINA STAR OPTOELECTRONICS TECHNOLOGY CO., LTD., Hubei (CN)

(*) Notice: Subject to any disclaimer, the term of this patent is extended or adjusted under 35 U.S.C. 154(b) by 120 days.

(21) Appl. No.: 15/313,912

(22) PCT Filed: Oct. 13, 2016

(86) PCT No.: PCT/CN2016/101953
§ 371 (c)(1),
(2) Date: Nov. 23, 2016

(87) PCT Pub. No.: WO2018/040236
PCT Pub. Date: Mar. 8, 2018

(65) Prior Publication Data
US 2018/0182982 A1 Jun. 28, 2018

(30) Foreign Application Priority Data
Aug. 31, 2016 (CN) .......................... 2016 1 0783888

(51) Int. Cl.
H01L 51/52 (2006.01)
H01L 51/00 (2006.01)
H01L 27/32 (2006.01)

(52) U.S. Cl.
CPC ...... *H01L 51/0097* (2013.01); *H01L 27/3209* (2013.01); *H01L 27/3267* (2013.01);
(Continued)

(58) Field of Classification Search
None
See application file for complete search history.

(56) References Cited

U.S. PATENT DOCUMENTS

2003/0132446 A1* 7/2003 Guenther .............. H01L 25/048
257/88
2005/0057149 A1* 3/2005 Herranen .................. G09F 9/33
313/504
(Continued)

FOREIGN PATENT DOCUMENTS

CN 102254898 A 11/2011
KR 100624131 B1 9/2006

OTHER PUBLICATIONS

English abstract translation of KR 100624131.
(Continued)

*Primary Examiner* — Michael Lebentritt
(74) *Attorney, Agent, or Firm* — WPAT, PC

(57) ABSTRACT

The present invention provides a double-sided organic lighting emitting diode (OLED) display device, which comprises a first display element, a second display element, a first encapsulation layer, and a second encapsulation layer. The first encapsulation layer extends from one side or two sides of the first baseplate, and curvedly overlaps on the first emitting portion. The second encapsulation layer extends from one side or two sides of the second baseplate, and curvedly overlaps on the second emitting portion. The first encapsulation layer and the second encapsulation layer both are closely encapsulated with at least one of the first baseplate and the second baseplate by sealant, respectively.

19 Claims, 7 Drawing Sheets

(52) U.S. Cl.
CPC ...... *H01L 51/5246* (2013.01); *H01L 51/5253* (2013.01); *H01L 51/5237* (2013.01); *H01L 2251/5323* (2013.01)

(56) References Cited

U.S. PATENT DOCUMENTS

| | | | |
|---|---|---|---|
| 2007/0126354 A1* | 6/2007 | Chao | H01L 25/048 313/512 |
| 2009/0130941 A1 | 5/2009 | Boroson et al. | |
| 2013/0076268 A1 | 3/2013 | Choi et al. | |
| 2015/0041766 A1 | 2/2015 | Naijo | |

OTHER PUBLICATIONS

English abstract translation of CN 102254898.
Office Action from Chinese Patent Office, application No. 201610783888.X dated Jun. 26, 2017.

* cited by examiner

DOUBLE-SIDED OLED DISPLAY DEVICE

BACKGROUND OF THE INVENTION

Field of Invention

The present invention relates to a double-sided organic lighting emitting diode (OLED), and more particularly to a double-sided OLED display device which achieves a narrow bezel design using a preserved baseplate as an encapsulation layer.

Description of Prior Art

With technical development, people are asking more and more about double-sided display devices, particularly about double-sided organic lighting emitting diode (OLED) display devices.

While using thin-film encapsulation, an encapsulation layer of a typical double-sided OLED device needs to encapsulate two sides of a thin-film, with additional encapsulation thin-film is manufactured. When applied to an outer-box encapsulation, the encapsulation glue layer on the outer-box needs to have enough contact width with the baseplate, but it is not beneficial to narrow bezel and to increase a screen to body ratio. Meanwhile, double-sided displayers are usually used in various environments and tough situations, such as outdoor display board and billboard, the double-sided displayers need to be full encapsulated, to resist moisture from entering into, to decrease lifetime of an active matrix organic lighting emitting diode (AMOLED).

Hence, it is need to provide a double-sided OLED display device, to solve the problem of the typical art.

SUMMARY OF THE INVENTION

The objective of the present application is to provide a double-sided OLED display device which achieves narrow bezel by applying a preserved baseplate as an encapsulation layer, to solve the technical issue that the typical double-sided organic lighting emitting diode (OLED) display device requires an additional encapsulation layer and is inconvenient to realize a narrow frame design.

The present application provides a double-sided OLED display device, which comprises a first display element, a second display element, a first encapsulation layer, and a second encapsulation layer. The first display element is disposed on the second display element, and the first display element and the second display element have opposite emitting directions.

The first display element comprises a first baseplate and a first emitting portion disposed on the first baseplate. The second display element comprises a second baseplate and a second emitting portion disposed on the first baseplate.

The first encapsulation layer extends from one side or two sides of the first baseplate, and curvedly overlaps on the first emitting portion. The second encapsulation layer extends from one side or two sides of the second baseplate, and curvedly overlaps on the second emitting portion. The first encapsulation layer and the second encapsulation layer both are closely encapsulated with at least one of the first baseplate and the second baseplate by sealant, respectively.

Outer surfaces of the first emitting portion and the second emitting portion are completely covered with a thin-film encapsulation layer.

The first baseplate and the second baseplate are both soft baseplates.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer and the second encapsulation layer extend from one side of the baseplate. The first encapsulation layer is closely encapsulated with the top surface of the baseplate by the sealant. The second encapsulation layer is closely encapsulated with the bottom surface of the baseplate by the sealant.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer and the second encapsulation layer extend from one side of the baseplate.

A cross-sectional area of the first emitting portion is larger than a cross-sectional area of the second emitting portion. An empty space is defined at the bottom surface of another side of the baseplate and adjacent to the second emitting portion.

The first encapsulation layer is closely encapsulated with the top surface of the baseplate by the sealant. The first encapsulation layer covers the empty space, to be closely encapsulated with a top surface of the empty space by the sealant. The second encapsulation layer is closely encapsulated with the bottom surface of the baseplate by the sealant. The second encapsulation layer covers the empty space, to be performed adhesive encapsulation with a part of the first encapsulation layer covering on the empty space by the sealant.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer comprises a first left encapsulation layer extended from upper-left side of the baseplate and a first right encapsulation layer extended from upper-right side of the baseplate. The second encapsulation layer comprises a second left encapsulation layer extended from bottom-left side of the baseplate and a second right encapsulation layer extended from bottom-right side of the baseplate.

The first left encapsulation layer and the first right encapsulation layer adhere integrally and are closely encapsulated with the top surface of the baseplate. The second left encapsulation layer and the second right encapsulation layer adhere integrally and are closely encapsulated with the bottom surface of the baseplate.

In the double-sided OLED display device of the present application, the first left encapsulation layer and the first right encapsulation layer both cover the first emitting portion. Vertical contact regions of the first left encapsulation layer and the first right encapsulation layer, which are located at two sides of the first emitting portion, are closely encapsulated by the sealant.

The second left encapsulation layer and the second right encapsulation layer both cover the second emitting portion. Vertical contact regions of the second left encapsulation layer and the second right encapsulation layer, which are located at two sides of the second emitting portion, are closely encapsulated by the sealant.

In the double-sided OLED display device of the present application, horizontal contact regions of a part of the first left encapsulation layer and the first right encapsulation layer, which are located at two sides of the first emitting portion, are closely encapsulated by the sealant.

Horizontal contact regions of a part of the second left encapsulation layer and the second right encapsulation layer, which are located at two sides of the second emitting portion, are closely encapsulated by the sealant.

In the double-sided OLED display device of the present application, the first left encapsulation layer and the first right encapsulation layer both cover a top of the first emitting portion. Contact regions of the first left encapsulation layer and the first right encapsulation layer, which are located on the top of the first emitting portion, are closely encapsulated by the sealant.

The second left encapsulation layer and the second right encapsulation layer both cover a top of the second emitting portion. Contact regions of the second left encapsulation layer and the second right encapsulation layer, which are located on the top of the second emitting portion, are closely encapsulated by the sealant.

In the double-sided OLED display device of the present application, the first display element and the second display element are both top emitting display elements and disposed back to back.

Bottoms of the first baseplate and the second baseplate are adhesively fixed by an adhering layer. The first encapsulation layer and the second encapsulation layer extend from a same side of the first baseplate and the second baseplate, correspondingly.

The first encapsulation layer and the first baseplate are closely encapsulated by the sealant. The second encapsulation layer and the second baseplate are closely encapsulated by the sealant.

In the double-sided OLED display device of the present application, the first display element and the second display element are both bottom emitting display elements and disposed oppositely.

The first encapsulation layer and the second encapsulation layer extend from a same side of the first baseplate and the second baseplate, correspondingly.

The first encapsulation layer and the first baseplate are closely encapsulated by the sealant. The second encapsulation layer and the second baseplate are closely encapsulated by the sealant.

The first encapsulation layer and the second encapsulation layer are adhesively fixed by an adhering layer.

The present application further provides a double-sided OLED display device, which comprises a first display element, a second display element, a first encapsulation layer, and a second encapsulation layer. The first display element is disposed on the second display element, and the first display element and the second display element have opposite emitting directions.

The first display element comprises a first baseplate and a first emitting portion disposed on the first baseplate. The second display element comprises a second baseplate and a second emitting portion disposed on the first baseplate.

The first encapsulation layer extends from one side or two sides of the first baseplate, and curvedly overlaps on the first emitting portion. The second encapsulation layer extends from one side or two sides of the second baseplate, and curvedly overlaps on the second emitting portion. The first encapsulation layer and the second encapsulation layer both are closely encapsulated with at least one of the first baseplate and the second baseplate by sealant, respectively.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer and the second encapsulation layer extend from one side of the baseplate. The first encapsulation layer is closely encapsulated with the top surface of the baseplate by the sealant. The second encapsulation layer is closely encapsulated with the bottom surface of the baseplate by the sealant.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer and the second encapsulation layer extend from one side of the baseplate.

A cross-sectional area of the first emitting portion is larger than a cross-sectional area of the second emitting portion. An empty space is defined at the bottom surface of another side of the baseplate and adjacent to the second emitting portion.

The first encapsulation layer is closely encapsulated with the top surface of the baseplate by the sealant. The first encapsulation layer covers the empty space, to be closely encapsulated with a top surface of the empty space by the sealant. The second encapsulation layer is closely encapsulated with the bottom surface of the baseplate by the sealant. The second encapsulation layer covers the empty space, to be performed adhesive encapsulation with a part of the first encapsulation layer covering on the empty space by the sealant.

In the double-sided OLED display device of the present application, the first display element and the second display element are both top emitting display elements and disposed back to back.

The first baseplate and the second baseplate integrally constitute a baseplate. The first emitting portion is on a top surface of the baseplate, the second emitting portion is on a bottom surface of the baseplate. The first encapsulation layer and the second encapsulation layer are separated from each other. The first encapsulation layer comprises a first left encapsulation layer extended from upper-left side of the baseplate and a first right encapsulation layer extended from upper-right side of the baseplate. The second encapsulation layer comprises a second left encapsulation layer extended from bottom-left side of the baseplate and a second right encapsulation layer extended from bottom-right side of the baseplate.

The first left encapsulation layer and the first right encapsulation layer adhere integrally and are closely encapsulated with the top surface of the baseplate. The second left encapsulation layer and the second right encapsulation layer adhere integrally and are closely encapsulated with the bottom surface of the baseplate.

In the double-sided OLED display device of the present application, the first left encapsulation layer and the first right encapsulation layer both cover the first emitting portion. Vertical contact regions of the first left encapsulation layer and the first right encapsulation layer, which are located at two sides of the first emitting portion, are closely encapsulated by the sealant.

The second left encapsulation layer and the second right encapsulation layer both cover the second emitting portion. Vertical contact regions of the second left encapsulation layer and the second right encapsulation layer, which are located at two sides of the second emitting portion, are closely encapsulated by the sealant.

In the double-sided OLED display device of the present application, horizontal contact regions of a part of the first left encapsulation layer and the first right encapsulation layer, which are located at two sides of the first emitting portion, are closely encapsulated by the sealant.

Horizontal contact regions of a part of the second left encapsulation layer and the second right encapsulation layer, which are located at two sides of the second emitting portion, are closely encapsulated by the sealant.

In the double-sided OLED display device of the present application, the first left encapsulation layer and the first right encapsulation layer both cover a top of the first emitting portion. Contact regions of the first left encapsulation layer and the first right encapsulation layer, which are located on the top of the first emitting portion, are closely encapsulated by the sealant.

The second left encapsulation layer and the second right encapsulation layer both cover a top of the second emitting portion. Contact regions of the second left encapsulation layer and the second right encapsulation layer, which are located on the top of the second emitting portion, are closely encapsulated by the sealant.

In the double-sided OLED display device of the present application, the first display element and the second display element are both top emitting display elements and disposed back to back.

Bottoms of the first baseplate and the second baseplate are adhesively fixed by an adhering layer. The first encapsulation layer and the second encapsulation layer extend from a same side of the first baseplate and the second baseplate, correspondingly.

The first encapsulation layer and the first baseplate are closely encapsulated by the sealant. The second encapsulation layer and the second baseplate are closely encapsulated by the sealant.

In the double-sided OLED display device of the present application, the first display element and the second display element are both bottom emitting display elements and disposed oppositely.

The first encapsulation layer and the second encapsulation layer extend from a same side of the first baseplate and the second baseplate, correspondingly.

The first encapsulation layer and the first baseplate are closely encapsulated by the sealant. The second encapsulation layer and the second baseplate are closely encapsulated by the sealant.

The first encapsulation layer and the second encapsulation layer are adhesively fixed by an adhering layer.

In the double-sided OLED display device of the present application, outer surfaces of the first emitting portion and the second emitting portion are completely covered with a thin-film encapsulation layer.

Compared with the typical double-sided OLED display device, the double-sided OLED of the present application applies an arrangement by using the preserved baseplate as an encapsulation layer, which has below benefits: 1. Convenient for narrow bezel; 2. Complete use of the baseplate layer and no encapsulation layer such as encapsulation thin-film or encapsulation outer-box are need to be manufactured additionally; 3. The preserved baseplate as the encapsulation layer has thinner thickness, it is convenient to light and thin the displayer; 4. Sealant and the preserved baseplate as the encapsulation layer have an extremely large width adhering plane, the sealant layer with large width can ease the entrance of moisture, to increase the life time of the OLED displayer; to solve the technical issue that the typical double-sided OLED display device requires an additional encapsulation layer and is inconvenient to realize a narrow frame.

In order to make the above description of the present invention much clearly understood, preferred embodiments of the present invention will now be described in detail with reference to the accompanying drawings:

DETAILED DESCRIPTION OF THE PREFERRED EMBODIMENTS

Figure 1:
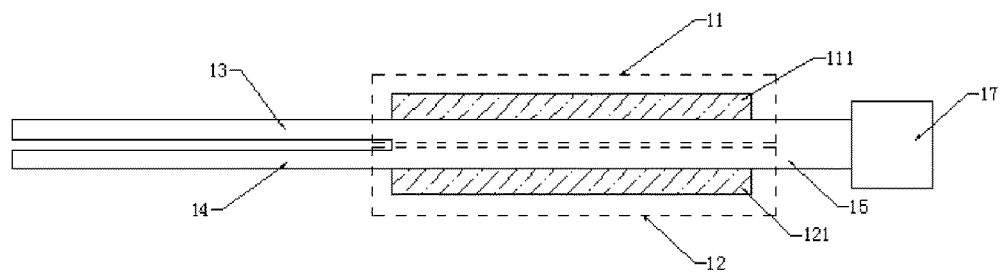
FIG. 1 is a structural illustrative diagram of a first preferred embodiment of a double-sided organic lighting emitting diode (OLED) display device before encapsulation of the present invention.

The following description of the embodiments is made with reference to the accompanying drawings, illustrating specific embodiments in which the present invention may be practiced. The terms such as "up", "down", "front", "back", "left", "right", "inside", "outside", "side", etc. are merely referred the direction of the accompanying drawings. Accordingly, the use of a directional term is used to describe and to understand the present invention and is not intended to limit the invention.

In the drawings, units having similar structures are denoted by the same reference numerals.

Figure 2:
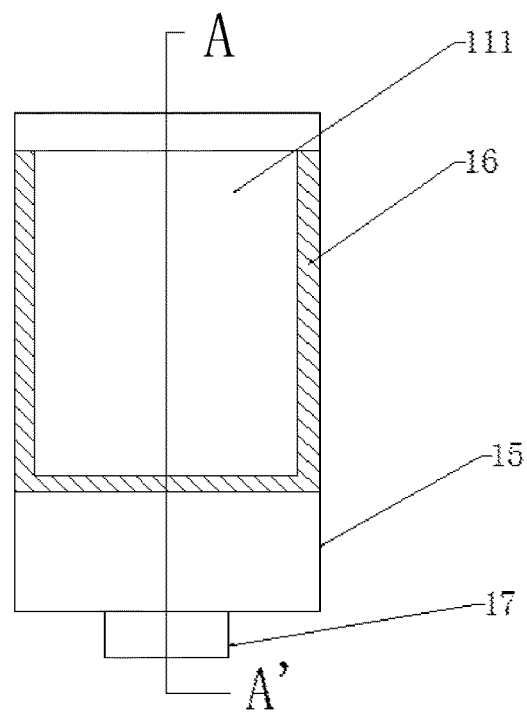
FIG. 2 is a front structural illustrative diagram of a first preferred embodiment of the double-sided OLED display device after encapsulation of the present invention.
Figure 3:
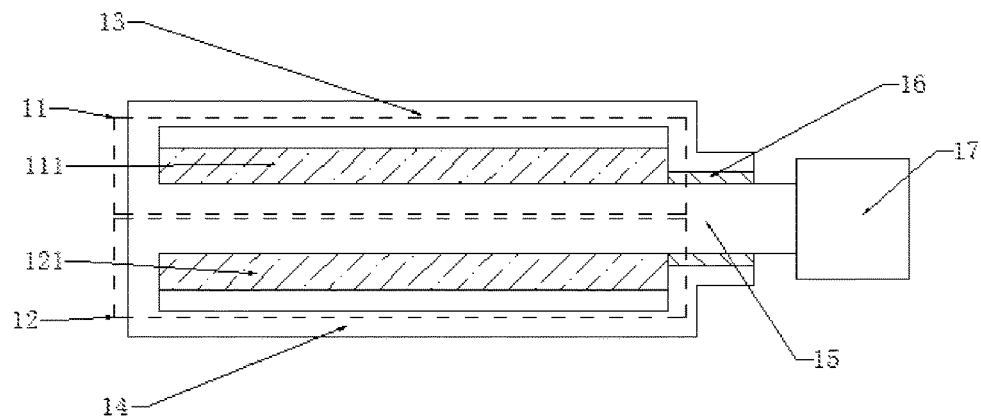
FIG. 3 is a cross-sectional diagram along sectional line AA' of FIG. 2.

Please refer to FIGS. 1-3, FIG. 1 is a structural illustrative diagram before encapsulation of a first preferred embodiment of the double-sided organic lighting emitting diode (OLED) display device of the present invention. FIG. 2 is a front structural illustrative diagram after encapsulation of a first preferred embodiment of the double-sided OLED display device of the present invention. FIG. 3 is a cross-sectional diagram along sectional line AA' of FIG. 2. The double-sided OLED display device comprises a first display element 11, a second display element 12, a first encapsulation layer 13, a second encapsulation layer 14 and a control system 17.

The first display element 11 is disposed on the second display element 12, and the first display element and the second display element have opposite emitting directions. The first display element 11 comprises a first baseplate and a first emitting portion 111 disposed on the first baseplate. The second display element 12 comprises a second baseplate and a second emitting portion 121 disposed on the first baseplate. The first display element 11 and the second display element 12 are electrically connected with the control system 17 through soft circuit board or anisotropic conductive film.

The first display element 11 and the second display element 12 are both top emitting display elements and disposed back to back. The first baseplate and the second baseplate integrally constitute a baseplate 15. The first emitting portion 111 is on a top surface of the baseplate, the second emitting portion 121 is on a bottom surface of the baseplate. The first encapsulation layer 13 extends from one side of the baseplate 15, and curvedly overlaps on the first emitting portion 111. The second encapsulation layer 14 extends from the same side of the baseplate 15, and curvedly overlaps on the second emitting portion 121.

The first encapsulation layer 13 is closely encapsulated with the top surface of the baseplate 15 by sealant 16. The second encapsulation layer 14 is closely encapsulated with the bottom surface of the baseplate 15 by the sealant 16.

In order to make the present preferred embodiment more convenient to encapsulation, the first encapsulation layer 13 and the second encapsulation layer 14 are separated from each other. Of course the first encapsulation layer 13 and the second encapsulation layer 14 can be adhered before manufacturing by an adhering glue; however, with the progress of the manufacturing process, the adhering glue will be damaged during the high temperature of the manufacturing process, which also makes the first encapsulation layer 13 and the second encapsulation layer 14 to be easily separated.

Selectively, during the baseplate manufacturing process, the adhering glue can be added at the position of the baseplate as the extending encapsulation layer. When finishing the manufacture of the emitting layer and before the encapsulation process, the two extending encapsulation layers can be separated by irradiating the adhering glue with a laser, or the adhering glue can be stripped by a physical method after the large baseplate is cut into small baseplates.

Additional, in some methods, the adhering glue can be a single layer or multiple layers.

In some methods, the adhering glue is only applied on the extending encapsulation layer during the baseplate manufacturing process. However, in some methods, the adhering glue is applied on the entire baseplate and the extending encapsulation layer, and is only separated/stripped until the extending encapsulation layer at the separating/stripping process before encapsulation process.

It is understandable that the baseplate 15 is preferred to be a soft baseplate, for the soft baseplate is easily bended and encapsulated during the encapsulation process. The baseplate 15 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the baseplate 15 can be formed by not entirely soft but bendable material, such as a thin and transparent metal etc.

Selectively, the baseplate 15 comprises at least one of an organic layer and an inorganic layer, where the organic layer is used to provide functions of support, protection and flatness, and the inorganic layer is used to provide functions of insulating and blocking moisture from entering. Of course, the structure of baseplate 15 is selectable, and the baseplate 15 has a plurality symmetrical organic layers and inorganic layers overlapping orderly, with respect to the first encapsulation layer 13 and the second encapsulation layer 14.

However, the first encapsulation layer 13 and the second encapsulation layer 14 can be selectively chosen to have a desired hierarchical structure from the multilayer structure of the baseplate 15 for encapsulation.

During the actual encapsulation process of the preferred embodiment, first, the first encapsulation layer 13 extending from one side of the baseplate 15 upwardly covers the first emitting portion 111 of the entire first display element 11.

Then, the edge portion of the first encapsulation layer 13 is closely encapsulated with the top surface of the baseplate 15 by the sealant 16.

Then, the preferred embodiment is turned to make the un-encapsulated second display element 12 dispose on the working plane.

Then, the second encapsulation layer 14 extending from the same side of the baseplate 15 upwardly covers the entire second emitting portion 121.

Finally, the edge portion of the second encapsulation layer 14 is closely encapsulated with the bottom surface of the baseplate 15 by the sealant 16.

The encapsulation process of the double-sided OLED display device of the preferred embodiment is complete.

Figure 4:
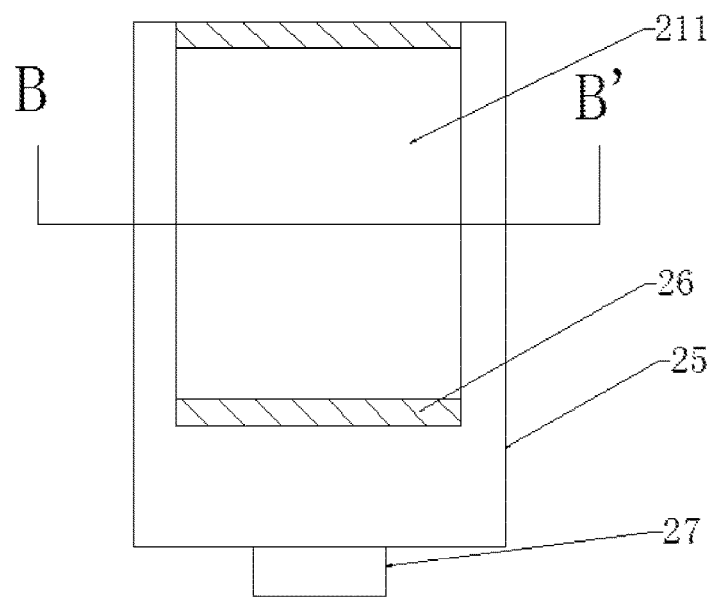
FIG. 4 is a front structural illustrative diagram of a second preferred embodiment of the double-sided OLED display device after encapsulation of the present invention.
Figure 5:
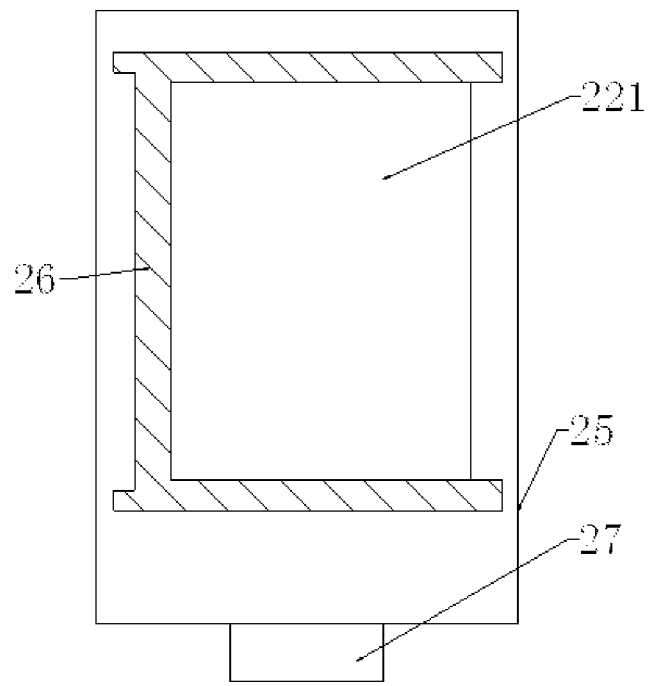
FIG. 5 is a back structural illustrative diagram of a second preferred embodiment of the double-sided OLED display device after encapsulation of the present invention.
Figure 6:
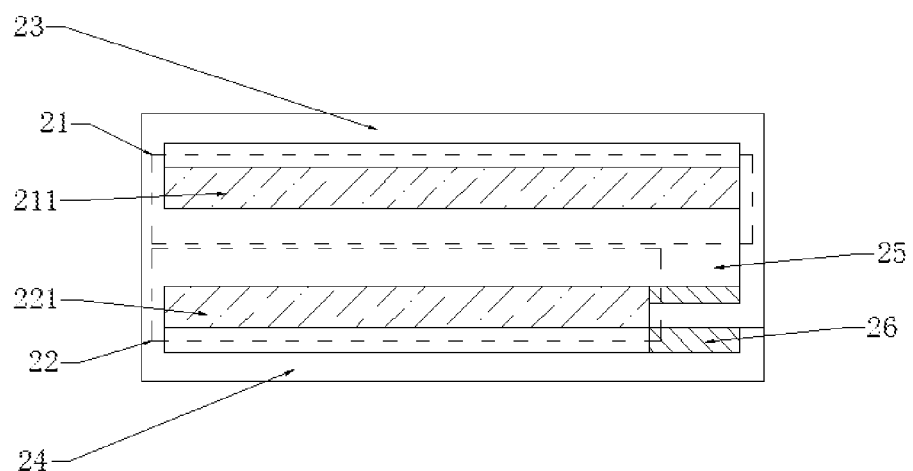
FIG. 6 is a cross-sectional diagram along sectional line BB' of FIG. 5.

The double-sided OLED of the preferred embodiment uses an arrangement by using the preserved baseplate as an encapsulation layer, which has below benefits: 1. convenient for narrow bezel; 2. complete use of the baseplate layer and no encapsulation layer, such as encapsulation thin-film or encapsulation outer-box, need to be additionally manufactured; 3. the preserved baseplate as the encapsulation layer has thinner thickness, it is convenient to make the displayer light and thin; 4. Sealant and the preserved baseplate as the encapsulation layer have an extremely large width adhering plane, the sealant layer with large width can ease the entrance of moisture, to increase the life time of the OLED displayer Please refer to FIGS. 4-6. FIG. 4 is a front structural illustrative diagram after encapsulation of a second preferred embodiment of the double-sided OLED display device of the present invention. FIG. 5 is a back structural illustrative diagram after encapsulation of a second preferred embodiment of the double-sided OLED display device of the present invention. FIG. 6 is a cross-sectional diagram along sectional line BB' of FIG. 5. The double-sided OLED display device comprises a first display element 21, a second display element 22, a first encapsulation layer 23, a second encapsulation layer 44 and a control system 27.

The first display element 21 is disposed on the second display element 22, and the first display element and the second display element have opposite emitting directions. The first display element 21 comprises a first baseplate and a first emitting portion 211 disposed on the first baseplate. The second display element 22 comprises a second baseplate and a second emitting portion 221 disposed on the first baseplate. The first display element 21 and the second display element 22 are electrically connected with the control system 27 through a soft circuit board or an anisotropic conductive film.

The first display element 21 and the second display element 22 are both top emitting display elements and disposed back to back. The first baseplate and the second baseplate integrally constitute a baseplate 25. The first emitting portion 211 is on a top surface of the baseplate, the second emitting portion 221 is on a bottom surface of the baseplate. The first encapsulation layer 23 extends from one side of the baseplate 25, and curvedly overlaps on the first emitting portion 211. The second encapsulation layer 24 extends from the same side of the baseplate 25, and curvedly overlaps on the second emitting portion 221.

Compared with the first preferred embodiment, in the present preferred embodiment, a cross-sectional area of the first emitting portion 211 is larger than a cross-sectional area of the second emitting portion 221. An empty space is defined at the bottom surface of another side of the baseplate 25 and adjacent to the second emitting portion 221.

The first encapsulation layer 23 is closely encapsulated with the top surface of the baseplate 25 by the sealant 26. The first encapsulation layer 23 covers the empty space, to be closely encapsulated with a top surface of the empty space (a bottom surface of the baseplate 25) by the sealant 26. The second encapsulation layer 24 is closely encapsulated with the bottom surface of the baseplate 25 by the sealant 26. The second encapsulation layer 24 covers the empty space, to be performed adhesive encapsulation with a part of the first encapsulation layer 23 covering the empty space by the sealant 26.

In order to make the present preferred embodiment can be more convenient to encapsulation, the first encapsulation layer 23 and the second encapsulation layer 24 are separated from each other. Of course that the first encapsulation layer 23 and the second encapsulation layer 24 can be adhered before manufacturing by an adhering glue, however, with the progress of the manufacturing process, the adhering glue will be damaged during the high temperature of the manufacturing process, which also make the first encapsulation layer 23 and the second encapsulation layer 24 to be easily separated.

Selectively, during the baseplate manufacturing process, the adhering glue can be added at the position of the baseplate as the extending encapsulation layer. When finishing the manufacture of the emitting layer and before the encapsulation process, the two extending encapsulation layers can be separated by irradiating the adhering glue with laser, or the adhering glue can be stripped by a physical method after the large baseplate is cut into small baseplates.

Additional, in some methods, the adhering glue can be a single layer or multiple layers.

In some methods. The adhering glue is only distributed at the extending encapsulation layer during the baseplate manufacturing process. However, in some methods, the adhering glue is distributed at the entire baseplate and the extending encapsulation layer, and is only separated/stripped until the extending encapsulation layer at the separating/stripping process before encapsulation process.

It is understandable that the baseplate 25 is preferred to be a soft baseplate, for the soft baseplate is easily to be bended and encapsulated during the encapsulation process. The baseplate 25 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the baseplate 25 can be formed by not entirely soft but bendable material, such as a thin and transparent metal etc.

Selectively, the baseplate 25 comprises at least one of organic layer and inorganic layer, the organic layer is used to provide functions of support, protection and flatness, the inorganic layer is used to provide functions of insulating and blocking the entrance of moisture. Of course, the structure of baseplate 25 is selectable, the baseplate 25 has a plurality symmetrical organic layers and inorganic layers overlapping orderly, with respective to the first encapsulation layer 23 and the second encapsulation layer 24.

However, the first encapsulation layer 23 and the second encapsulation layer 24 can be selectively chosen a desired hierarchical structure from the multilayer structure of the baseplate 25 for encapsulation.

During the actual encapsulation process of the preferred embodiment, first, the first encapsulation layer 23 extending from one side of the baseplate 25 upwardly covers the first emitting portion 211 of the entire first display element 21.

Then, the edge portion of the first encapsulation layer 23 is closely encapsulated with the top surface of the baseplate 25 by the sealant 26.

Then, the preferred embodiment is turned to make the un-encapsulated second display element 22 dispose on the working plane, and the first encapsulation layer 23 is continued to cover into the empty space.

Then, the part of the first encapsulation layer 23, which covers into the empty space, is closely encapsulated with the bottom surface of the baseplate 25 by the sealant 26. Then, the second encapsulation layer 24 extending from the same side of the baseplate 25 upwardly covers the entire second emitting portion 221.

Finally, the edge portion of the second encapsulation layer 24 is closely encapsulated with the bottom surface of the baseplate 25 by the sealant, and the second encapsulation layer 24 covers the empty space, to be performed adhesive encapsulation with a part of the first encapsulation layer 23 covering on the empty space by the sealant 26.

The encapsulation process of the double-sided OLED display device of the preferred embodiment is completed.

The benefits of the double-sided OLED display device of the preferred embodiment is: a encapsulation method is provided when the cross-sectional areas of the emitting portions of the encapsulation display elements have differences, by entirely using an empty space of one of the emitting portions, which has the smaller cross-sectional area, as a encapsulation area of the sealant 26.

Figure 7:
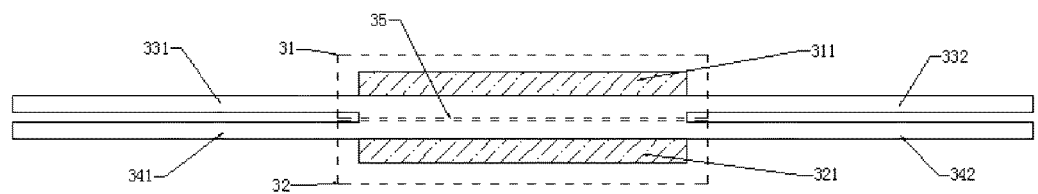
FIG. 7 is a structural illustrative diagram of a third preferred embodiment of the double-sided OLED display device before encapsulation of the present invention.
Figure 8:
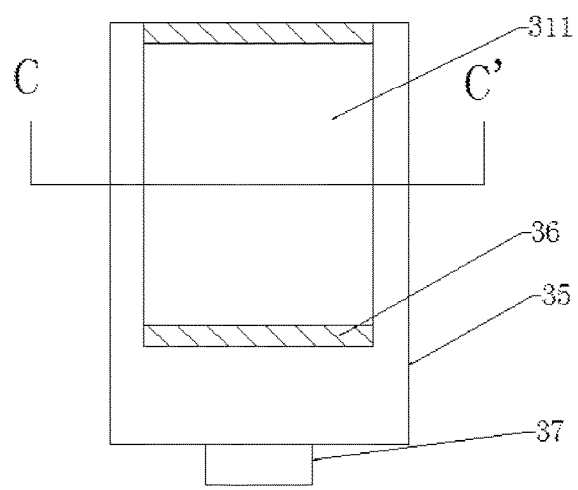
FIG. 8 is a front structural illustrative diagram of a third preferred embodiment of the double-sided OLED display device after encapsulation of the present invention.
Figure 9:
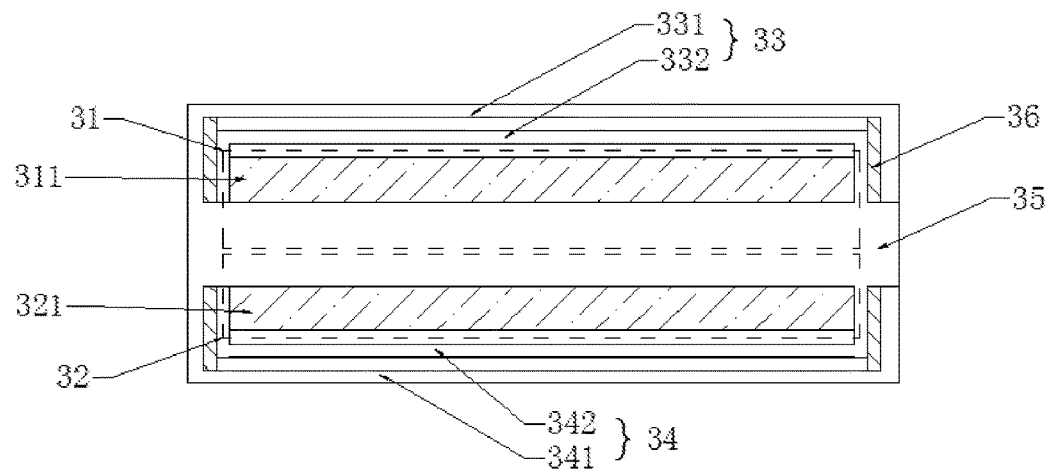
FIG. 9 is a cross-sectional diagram of a first encapsulation structure along sectional line CC' of FIG. 5.

Please refer to FIGS. 7-9. FIG. 7 is a structural illustrative diagram before encapsulation of a third preferred embodiment of the double-sided OLED display device of the present invention. FIG. 8 is a front structural illustrative diagram after encapsulation of a third preferred embodiment of the double-sided OLED display device of the present invention. FIG. 9 is a cross-sectional diagram of a first encapsulation structure along sectional line CC' of FIG. 5. The double-sided OLED display device comprises a first display element 31, a second display element 32, a first encapsulation layer 33, a second encapsulation layer 34 and a control system 37.

The first display element 31 is disposed on the second display element 32, and the first display element and the second display element have opposite emitting directions. The first display element 31 comprises a first baseplate and a first emitting portion 311 disposed on the first baseplate. The second display element 32 comprises a second baseplate and a second emitting portion 321 disposed on the first baseplate. The first display element 31 and the second display element 32 are electrically connected with the control system 37 through soft circuit board or anisotropic conductive film.

The first display element 31 and the second display element 32 are both top emitting display elements and disposed back to back. The first baseplate and the second baseplate integrally constitute a baseplate 35. The first emitting portion 311 is on a top surface of the baseplate, the second emitting portion 321 is on a bottom surface of the baseplate.

Comparing with the first preferred embodiment, in the present preferred embodiment, the first encapsulation layer 33 comprises a first left encapsulation layer 331 extended from upper-left side of the baseplate 35 and a first right encapsulation layer 332 extended from upper-right side of the baseplate 35, the second encapsulation layer 34 comprises a second left encapsulation layer 341 extended from bottom-left side of the baseplate 35 and a second right encapsulation layer 342 extended from bottom-right side of the baseplate 35.

The first left encapsulation layer 331 and the first right encapsulation layer 332 both cover the first emitting portion 311. Vertical contact regions of the first left encapsulation layer 331 and the first right encapsulation layer 332, which are located at two sides of the first emitting portion 311, are closely encapsulated to be an integral of the first encapsulation layer 33 by the sealant 36, the entire first encapsulation layer 33 is closely encapsulated with the top surface of the baseplate 35 by the sealant 36.

The second left encapsulation layer 341 and the second right encapsulation layer 342 both cover the second emitting portion 321. Vertical contact regions of the second left encapsulation layer 341 and the second right encapsulation layer 342, which are located at two sides of the second emitting portion 321, are closely encapsulated to be an integral of the second encapsulation layer 34 by the sealant 36, the entire second encapsulation layer 34 is closely encapsulated with the bottom surface of the baseplate 35 by the sealant 36.

In order to make the present preferred embodiment can be more convenient to encapsulation, the first encapsulation layer 33 and the second encapsulation layer 34 are separated from each other. Of course that the first encapsulation layer 33 and the second encapsulation layer 34 can be adhered before manufacturing by an adhering glue, however, with the progress of the manufacturing process, the adhering glue will be damaged during the high temperature of the manufacturing process, which also make the first encapsulation layer 33 and the second encapsulation layer 34 easily to be separated.

Selectively, during the baseplate manufacturing process, the adhering glue can be added at the position of the baseplate as the extending encapsulation layer. When finishing the manufacture of the emitting layer and before the encapsulation process, the two extending encapsulation layers can be separated by irradiating the adhering glue with laser, or the adhering glue can be stripped by physical method after the large baseplate is cut into small baseplate.

Additionally, in some methods, the adhering glue can be a single layer or multiple layers.

In some methods. The adhering glue is only distributed at the extending encapsulation layer during the baseplate manufacturing process. However, in some methods, the adhering glue is distributed at the entire baseplate and the extending encapsulation layer, and is only separated/stripped until the extending encapsulation layer at the separating/stripping process before encapsulation process.

It is understandable that the baseplate 35 is preferred to be a soft baseplate, for the soft baseplate is easily to be bended and encapsulated during the encapsulation process. The baseplate 35 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the baseplate 35 can be formed by not an entirely soft but bendable material, such as a thin and transparent metal etc.

Selectively, the baseplate 35 comprises at least one of an organic layer and an inorganic layer, where the organic layer is used to provide functions of support, protection and flatness, and the inorganic layer is used to provide functions of insulating and blocking moisture entrance. Of course, the structure of baseplate 35 is selectable, the baseplate 35 has a plurality symmetrical organic layers and inorganic layers overlapping orderly, with respective to the first encapsulation layer 33 and the second encapsulation layer 34.

However, the first encapsulation layer 33 and the second encapsulation layer 34 can be selectively chosen a desired hierarchical structure from the multilayer structure of the baseplate 35 for encapsulation.

During the actual encapsulation process of the preferred embodiment, first, the first right encapsulation layer 332 of the first encapsulation layer 33 extending from right-top side of the baseplate 35 upwardly covers the first emitting portion 311 of the entire first display element 31, then, the first left encapsulation layer 331 of the first encapsulation layer 33 extending from left-top side of the baseplate 35 upwardly covers on the first right encapsulation layer 332.

Then, vertical contact regions of the first left encapsulation layer 331 and the first right encapsulation layer 332, which are located at two sides of the first emitting portion 311, are closely encapsulated to be an integral of the first encapsulation layer 33 by the sealant 36.

Then, the entire first encapsulation layer 33 is closely encapsulated with the top surface of the baseplate 35 by the sealant 36.

Finally, the preferred embodiment is turned to make the un-encapsulated second display element 32 dispose on the working plane, and repeat the encapsulation steps of the first encapsulation layer 33.

The encapsulation process of the double-sided OLED display device of the preferred embodiment is completed.

In the double-sided OLED display device of the preferred embodiment, a dual encapsulation layer is disposed at both sides of the baseplate to make the encapsulation structure of the preferred embodiment more stable, thus increasing moisture proof effectiveness and protecting the encapsulation layer from the damage, and increasing lifetime of the preferred embodiment.

Figure 10:
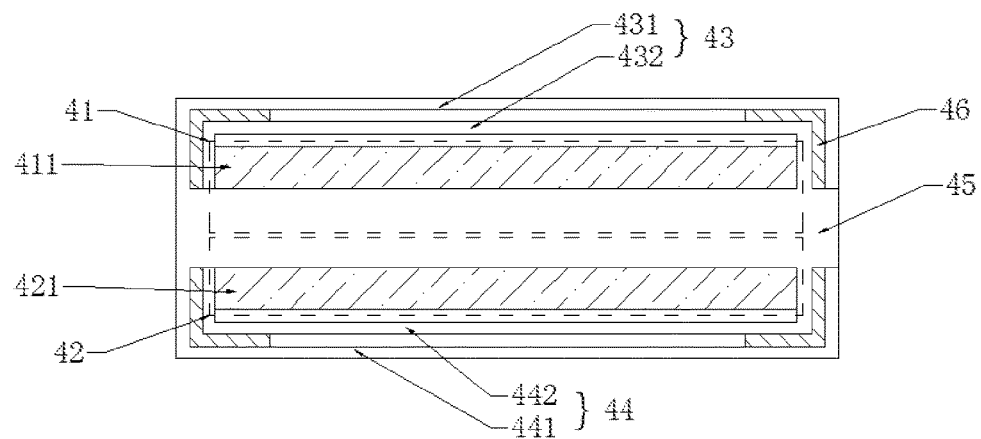
FIG. 10 is a structural illustrative diagram of a fourth preferred embodiment of the double-sided OLED display device after encapsulation of the present invention.

Please refer FIG. 10. FIG. 10 is a structural illustrative diagram after encapsulation of a fourth preferred embodiment of the double-sided OLED display device of the present invention. The double-sided OLED display device comprises a first display element 41, a second display element 42, a first encapsulation layer 43, a second encapsulation layer 44 and a control system 47.

The first display element 41 is disposed on the second display element 42, and the first display element and the second display element have opposite emitting directions. The first display element 41 comprises a first baseplate and a first emitting portion 411 disposed on the first baseplate. The second display element 42 comprises a second baseplate and a second emitting portion 421 disposed on the first baseplate. The first display element 41 and the second display element 42 are electrically connected with the control system 47 through a soft circuit board or an anisotropic conductive film.

The first display element 41 and the second display element 42 are both top emitting display elements and disposed back to back. The first baseplate and the second baseplate integrally constitute a baseplate 45. The first emitting portion 411 is on a top surface of the baseplate, the second emitting portion 421 is on a bottom surface of the baseplate.

Compared with the third preferred embodiment and based on the third preferred embodiment, in the present preferred embodiment, horizontal contact regions of the first left encapsulation layer 431 and the first right encapsulation layer 432, which are located at two sides of the first emitting portion 411, are closely encapsulated by the sealant 46, horizontal contact regions of the second left encapsulation layer 441 and the second right encapsulation layer 442, which are located at two sides of the second emitting portion 421, are closely encapsulated by the sealant 46, the entire second encapsulation layer 34 is closely encapsulated with the bottom surface of the baseplate 35 by the sealant 36.

The encapsulation process is similar or the same with the encapsulation process of the third preferred embodiment, to be specifically, please kindly refer to the encapsulation process of the third encapsulation process.

With adding the sealing encapsulation at the horizontal contact regions, the first encapsulation layer and the second encapsulation layer are stronger and more integrally stable, the stability of the preferred embodiment is raised accordingly.

Figure 11:
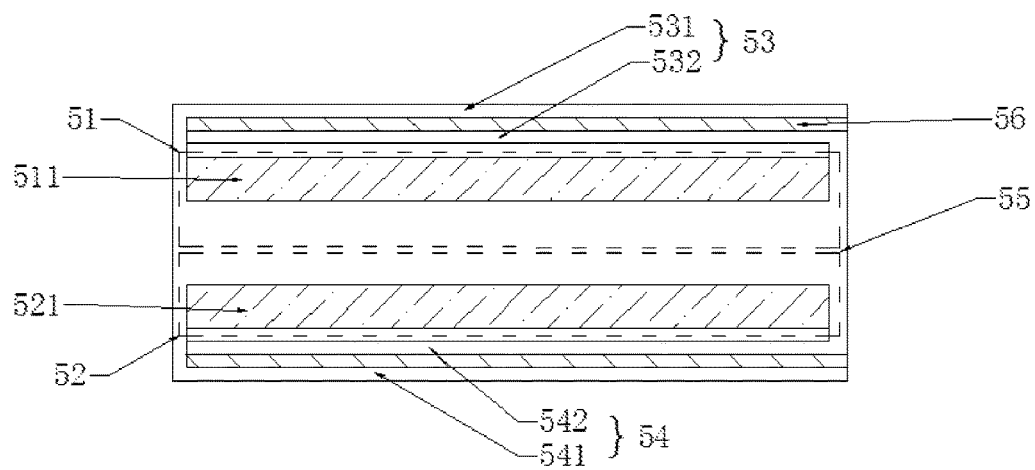
FIG. 11 is a structural illustrative diagram of a fifth preferred embodiment of the double-sided OLED display device after encapsulation of the present invention.

Please refer to FIG. 11. FIG. 11 is a structural illustrative diagram after encapsulation of a fifth preferred embodiment of the double-sided OLED display device of the present invention. The double-sided OLED display device comprises a first display element 51, a second display element 52, a first encapsulation layer 53, a second encapsulation layer 54 and a control system 57.

The first display element 51 is disposed on the second display element 52, and the first display element and the second display element have opposite emitting directions. The first display element 51 comprises a first baseplate and a first emitting portion 511 disposed on the first baseplate. The second display element 52 comprises a second baseplate and a second emitting portion 521 disposed on the first baseplate. The first display element 51 and the second display element 52 are electrically connected with the control system 57 through soft circuit board or anisotropic conductive film.

The first display element 51 and the second display element 52 are both top emitting display elements and disposed back to back. The first baseplate and the second baseplate integrally constitute a baseplate 55. The first emitting portion 511 is on a top surface of the baseplate, the second emitting portion 521 is on a bottom surface of the baseplate.

Comparing with the third preferred embodiment, in the preferred embodiment, the first left encapsulation layer 531 and the first right encapsulation layer 532 both cover a top of the first emitting portion 511, contact regions of the first left encapsulation layer 531 and the first right encapsulation layer 532, which are located on the top of the first emitting portion 511, are closely encapsulated by the sealant 56.

The second left encapsulation layer 541 and the second right encapsulation layer 542 both cover a top of the second emitting portion 511, contact regions of the second left encapsulation layer 541 and the second right encapsulation layer 542, which are located on the top of the second emitting portion 521, are closely encapsulated by the sealant 56.

It is evident that the adhesion of the top contact regions of the first encapsulation layer 53 and the second encapsulation layer 54 can be only limited within the edge portion of the top surface or be a whole adhesion around the top surface.

Comparing with the third preferred embodiment, the benefit of the preferred embodiment is: the material of the encapsulation layer is saved and the encapsulation process is simplified.

Figure 12:
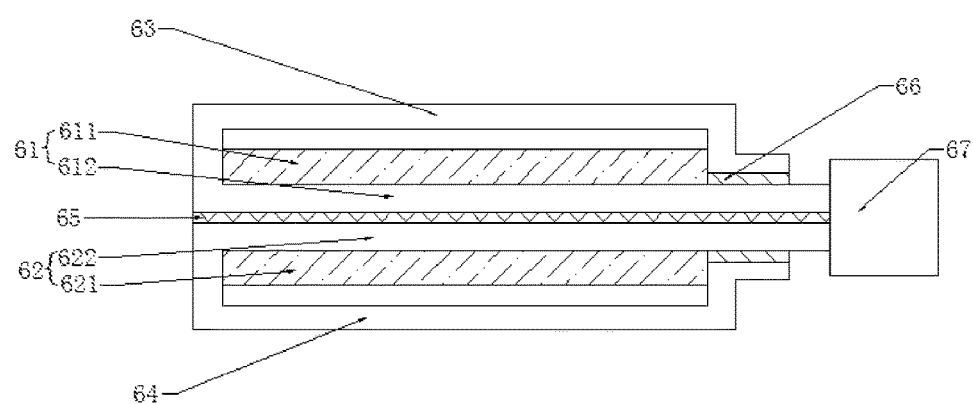
FIG. 12 is a structural illustrative diagram of a sixth preferred embodiment of the double-sided OLED display device after encapsulation of the present invention.

Please refer to FIG. 12. FIG. 12 is a structural illustrative diagram after encapsulation of a sixth preferred embodiment of the double-sided OLED display device of the present invention. The double-sided OLED display device comprises a first display element 61, a second display element 62, a first encapsulation layer 63, a second encapsulation layer 64, and a control system 67.

The first display element 61 is disposed on the second display element 62, and the first display element and the second display element have opposite emitting directions. The first display element 61 comprises a first baseplate 612 and a first emitting portion 611 disposed on the first baseplate 612. The second display element 62 comprises a second baseplate 622 and a second emitting portion 621 disposed on the first baseplate 622. The first display element 61 and the second display element 62 are electrically connected with the control system 67 through soft circuit board or anisotropic conductive film.

The first display element 61 and the second display element 62 are both top emitting display elements and disposed back to back. Bottoms of the first baseplate 612 and the second baseplate 622 are adhesively fixed by an adhering layer 65, the first encapsulation layer 63 extends from one side of the first baseplate 612 and curvedly overlaps on the first emitting portion 611, the second encapsulation layer 64 extends from one side of the second baseplate 622 which is the same side of the first baseplate 612 and curvedly overlaps on the second emitting portion 621.

The first encapsulation layer 63 and the first baseplate 612 are closely encapsulated by the sealant 66. The second encapsulation layer 64 and the second baseplate 622 are closely encapsulated by the sealant 66.

It is understandable that the first baseplate 612 and the second baseplate 622 are preferred to be a soft baseplate, for the soft baseplate is easily to be bended and encapsulated during the encapsulation process. The first baseplate 612 and the second baseplate 622 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the first baseplate 612 and the second baseplate 622 can be formed by not entirely soft but bendable material, such as a thin and transparent metal etc.

Selectively, the first baseplate 612 and the second baseplate 622 comprise at least one of organic layer and inorganic layer, the organic layer is used to provide functions of support, protection and flatness, the inorganic layer is used to provide functions of insulating and blocking the entrance of moisture. Of course, the structure of first baseplate 612 and the second baseplate 622 are selectable, the first baseplate 612 and the second baseplate 622 have a plurality symmetrical organic layers and inorganic layers overlapping orderly, with respective to the first encapsulation layer 63 and the second encapsulation layer 64.

However, the first encapsulation layer 63 and the second encapsulation layer 64 can be selectively chosen a desired hierarchical structure from the multilayer structure of the first baseplate 612 and the second baseplate 622 for encapsulation.

It is evident that the first encapsulation layer 63 and the second encapsulation layer 64 of the preferred embodiment can extend from two sides of the corresponding first baseplate 612 and the second baseplate 622, respectively, and the encapsulation process as the third preferred embodiment is performed afterwards.

The encapsulation process is similar or the same with the encapsulation process of the first preferred embodiment, to be specifically, please kindly refer to the encapsulation process of the first encapsulation process.

Comparing with the first preferred embodiment, in the preferred embodiment, an arrangement of a separated connection between the first baseplate and the second baseplate, the fixed connection of the first display element and the second display element is more flexible, the destruction, maintenance and replacement are convenient afterwards.

Figure 13:
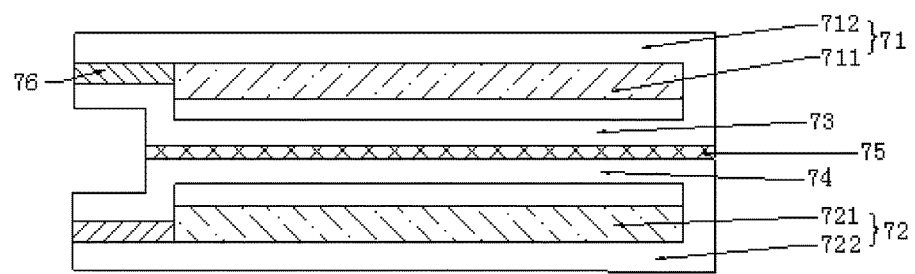
FIG. 13 is a structural illustrative diagram of a seventh preferred embodiment of the double-sided OLED display device after encapsulation of the present invention.

Please refer to FIG. 13. FIG. 13 is a structural illustrative diagram after encapsulation of a seventh preferred embodiment of the double-sided OLED display device of the present invention. The double-sided OLED display device comprises a first display element 71, a second display element 72, a first encapsulation layer 73, a second encapsulation layer 74 and a control system 77.

The first display element 71 is disposed on the second display element 72, and the first display element and the second display element have opposite emitting directions. The first display element 71 comprises a first baseplate 712 and a first emitting portion 711 disposed on the first baseplate 712. The second display element 72 comprises a second baseplate 722 and a second emitting portion 721 disposed on the first baseplate 722. The first display element 71 and the second display element 72 are electrically connected with the control system 77 through soft circuit board or anisotropic conductive film.

The first display element 71 and the second display element 72 are both bottom emitting display elements and disposed back to back. The first encapsulation layer 73 extends from one side of the first baseplate 712 and curvedly overlaps on the first emitting portion 711. The second encapsulation layer 74 extends from one side of the second baseplate 722 which is the same side of the first baseplate 712 and curvedly overlaps on the second emitting portion 721.

The first encapsulation layer 73 and the first baseplate 712 are closely encapsulated by the sealant 76. The second encapsulation layer 74 and the second baseplate 722 are closely encapsulated by the sealant 76. Then, the first encapsulation layer 73 and the second encapsulation layer 74 are fixedly adhered by an adhering layer 75.

It is understandable that the first baseplate 712 and the second baseplate 722 are preferred to be a soft baseplate, for the soft baseplate is easily to be bended and encapsulated during the encapsulation process. The first baseplate 712 and the second baseplate 722 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the first baseplate 712 and the second baseplate 722 can be formed by not entirely soft but bendable material, such as a thin and transparent metal, etc.

Selectively, the first baseplate 712 and the second baseplate 722 comprise at least one of organic layer and inorganic layer, the organic layer is used to provide functions of support, protection and flatness, the inorganic layer is used to provide functions of insulating and blocking the entrance of moisture. Of course, the structure of first baseplate 712 and the second baseplate 722 are selectable, the first baseplate 712 and the second baseplate 722 have a plurality symmetrical organic layers and inorganic layers overlapping orderly, with respective to the first encapsulation layer 73 and the second encapsulation layer 74.

However, the first encapsulation layer 73 and the second encapsulation layer 74 can be selectively chosen a desired hierarchical structure from the multilayer structure of the first baseplate 712 and the second baseplate 722 for encapsulation.

It is evident that the first encapsulation layer 73 and the second encapsulation layer 74 of the preferred embodiment can extend from two sides of the corresponding first baseplate 712 and the second baseplate 722, respectively, and the encapsulation process as the third preferred embodiment is performed afterwards.

During the actual encapsulation process of the preferred embodiment, first, the first encapsulation layer 73 extending from one side of the first baseplate 712 upwardly covers the first emitting portion 711 of the entire first display element 71.

Then, the edge portion of the first encapsulation layer 73 is closely encapsulated with the top surface of the first baseplate 712 by the sealant 76.

Then, the preferred embodiment is turned to make the un-encapsulated second display element 72 dispose on the working plane, and the encapsulation steps as mentioned above of the preferred embodiment.

Then, the second encapsulation layer 14 extending from the same side of the baseplate 15 upwardly covers the entire second emitting portion 121.

Finally, the first encapsulation layer 73 of the encapsulated first display element 71 and the second encapsulation layer 74 of the encapsulated second display element 72 are connected by the adhering layer 75.

The encapsulation process of the double-sided OLED display device of the preferred embodiment is completed.

In the preferred embodiment, both bottom emitting elements are encapsulated individually and integrated as a double-sided OLED display device, with respect to the bottom-emitted display element, the present preferred embodiment has benefits: 1. The encapsulation glue layer is disposed at one side, which has higher tolerance with the bezel width. It effectively decreases the width occupied by the encapsulation glue layer at other sides, which have lower tolerance with the bezel width. 2. Complete use of the baseplate layer and no encapsulation layer such as encapsulation thin-film or encapsulation outer-box are need to be manufactured additionally; 3. The preserved baseplate as the encapsulation layer has thinner thickness, it is convenient to light and thin the displayer; 4. The quantities of encapsulation layer at four sides of the double-sided displayer is reduced, then, the entrance area of the encapsulation layer, which the moisture/oxygen penetrates into the double-sided displayer is decreased accordingly, the lifetime of the OLED displayer is raised, too.

Figure 14:
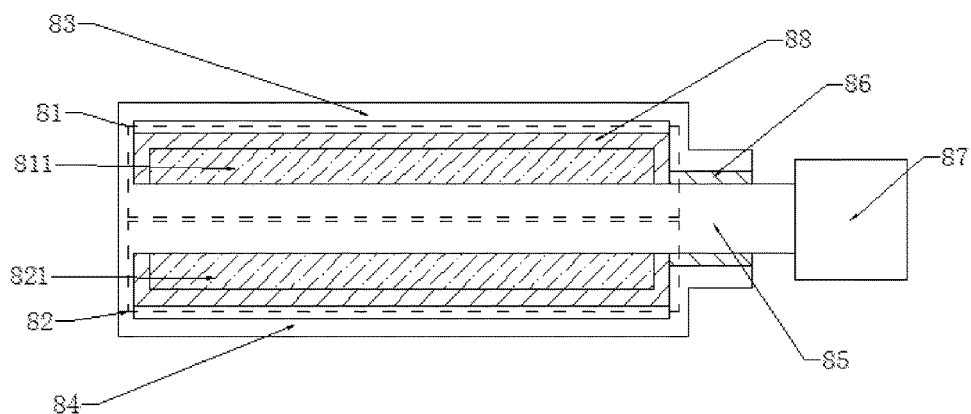
FIG. 14 is a structural illustrative diagram of an eighth preferred embodiment of the double-sided OLED display device after encapsulation of the present invention.

Please refer to FIG. 14. FIG. 14 is a structural illustrative diagram after encapsulation of an eighth preferred embodiment of the double-sided OLED display device of the present invention. The double-sided OLED display device comprises a first display element 81, a second display element 82, a first encapsulation layer 83, a second encapsulation layer 84 and a control system 87.

The first display element 81 is disposed on the second display element 82, and the first display element and the second display element have opposite emitting directions. The first display element 81 comprises a first baseplate and a first emitting portion 811 disposed on the first baseplate. The second display element 82 comprises a second baseplate and a second emitting portion 821 disposed on the first baseplate. The first display element 81 and the second display element 82 are electrically connected with the control system 87 through a soft circuit board or an anisotropic conductive film.

The first display element 81 and the second display element 82 are both top emitting display elements and disposed back to back. The first baseplate and the second baseplate integrally constitute a baseplate 85. The first emitting portion 811 is on a top surface of the baseplate, the second emitting portion 821 is on a bottom surface of the baseplate.

Compared with the first preferred embodiment, in the present preferred embodiment, in order to raise the ability of preventing moisture intrusion into the first emitting portion 811 and the second emitting portion 812, a thin-film encapsulation layer 88 covers the entire outer surface of the first emitting portion 811 and the second emitting portion 812, to cut off the contact between moisture and the two emitting portions. The first encapsulation layer 83 extends from one side of the baseplate 85, and curvedly overlaps on the thin-film encapsulation layer 88, which is on the first emitting portion 811. The second encapsulation layer 84 extends from the same side of the baseplate 85, and curvedly overlaps on the thin-film encapsulation layer 88, which is on the second emitting portion 821.

The first encapsulation layer 83 is closely encapsulated with the top surface of the baseplate 85 by the sealant 86. The second encapsulation layer 84 is closely encapsulated with the bottom surface of the baseplate 85 by the sealant 86.

In order to make the present preferred embodiment more convenient to encapsulation, the first encapsulation layer 83 and the second encapsulation layer 84 are separated from each other. Of course the first encapsulation layer 83 and the second encapsulation layer 84 can be adhered before manufacturing by an adhering glue, however, with the progress of the manufacturing process, the adhering glue will be damaged during the high temperature of the manufacturing process, which also make the first encapsulation layer 83 and the second encapsulation layer 84 easily to be separated.

Selectively, during the baseplate manufacturing process, the adhering glue can be added at the position of the baseplate as the extending encapsulation layer. When finishing manufacturing of the emitting layer and before the encapsulation process, the two extending encapsulation layers can be separated by irradiating the adhering glue with laser, or the adhering glue can be stripped by physical method after the large baseplate is cut into small baseplate.

Additional, in some methods, the adhering glue can be a single layer or multiple layers.

In some methods. The adhering glue is only distributed at the extending encapsulation layer during the baseplate manufacturing process. However, in some methods, the adhering glue is distributed at the entire baseplate and the extending encapsulation layer, and is only separated/stripped until the extending encapsulation layer at the separating/stripping process before encapsulation process.

It is understandable that the baseplate 85 is preferred to be a soft baseplate, for the soft baseplate is easily to be bended and encapsulated during the encapsulation process. The baseplate 85 can be any suitable soft-insulating material, the soft baseplate can be formed by polymer material such as Polyimide (PI), polycarbonate (PC), polyether sulfone (PES), polyethylene terephthalate (PET), polyethylene naphthalate (PEN), polyarylate (PAR) or glass fiber reinforced plastic (FRP). Selectively, the baseplate 85 can be formed by not entirely soft but bendable material, such as a thin and transparent metal etc.

Selectively, the baseplate 85 comprises at least one of organic layer and inorganic layer, the organic layer is used to provide functions of support, protection and flatness, the inorganic layer is used to provide functions of insulating and blocking the entrance of moisture. Of course, the structure of baseplate 85 is selectable, the baseplate 85 has a plurality symmetrical organic layers and inorganic layers overlapping orderly, with respective to the first encapsulation layer 83 and the second encapsulation layer 84.

However, the first encapsulation layer 83 and the second encapsulation layer 84 can be selectively chosen a desired hierarchical structure from the multilayer structure of the baseplate 85 for encapsulation.

During the actual encapsulation process of the preferred embodiment, first, the first encapsulation layer 83 extending from one side of the baseplate 85 upwardly covers the first emitting portion 811 of the entire first display element 81.

It is understood that covering the thin-film encapsulation layer on the outer surface of the emitting portion of the display element is not only suitable for top emitting display element, but also for bottom emitting display element.

Furthermore, as to the material of the thin-film encapsulation layer 88, silicon nitride, silicon oxide or aluminum oxide, and the like can be chosen, while the thin-film encapsulation layer 88 is not limited to a single layer structure, that is, a multi-layer film, for example, a silicon nitride film and a silicon oxide film, a silicon nitride film and an aluminum oxide film, or a combination of a silicon nitride film and a silicon oxide film and an aluminum oxide thin film. Of course, the thin-film encapsulation layer 88 may also include a suitable organic layer, such as a stacked structure of an organic layer and an inorganic layer.

The encapsulation process is similar or the same with the encapsulation process of the first preferred embodiment, to be specifically, please kindly refer to the encapsulation process of the first encapsulation process.

Comparing with the first preferred embodiment, the preferred embodiment raises the ability of preventing water penetration, with disposing the thin-film encapsulation layer, then, the emitting portion is protected, and the life time of the preferred embodiment is raised, too.

Although the present invention has been disclosed as preferred embodiments, the foregoing preferred embodiments are not intended to limit the present invention. Those of ordinary skill in the art, without departing from the spirit and scope of the present invention, can make various kinds of modifications and variations to the present invention. Therefore, the scope of the claims of the present invention must be defined.

What is claimed is:

1. A double-sided organic lighting emitting diode (OLED) display device, comprising: a first display element, a second display element, a first encapsulation layer, and a second encapsulation layer, wherein the first display element is disposed on the second display element, and the first display element and the second display element have opposite emitting directions;
   the first display element comprising a first baseplate and a first emitting portion disposed on the first baseplate, the second display element comprising a second baseplate and a second emitting portion disposed on the first baseplate;
   wherein the first encapsulation layer extends from one side or two sides of the first baseplate, and curvedly overlaps on the first emitting portion; the second encapsulation layer extends from one side or two sides of the second baseplate, and curvedly overlaps on the second emitting portion, the first encapsulation layer and the second encapsulation layer both closely encapsulated with at least one of the first baseplate and the second baseplate by a sealant, respectively;
   wherein outer surfaces of the first emitting portion and the second emitting portion, are completely covered with a thin-film encapsulation layer; and
   wherein the first baseplate and the second baseplate are both soft baseplates.

2. The double-sided OLED display device according to claim 1, wherein the first display element and the second display element are both top emitting display elements and disposed back to back;
   wherein the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer and the second encapsulation layer extend from one side of the baseplate; the first encapsulation layer is closely encapsulated with the top surface of the baseplate by the sealant, the second encapsulation layer is closely encapsulated with the bottom surface of the baseplate by the sealant.

3. The double-sided OLED display device according to claim 1, wherein the first display element and the second display element are both top emitting display elements and disposed back to back;
   wherein the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer and the second encapsulation layer extend from one side of the baseplate;
   a cross-sectional area of the first emitting portion is larger than a cross-sectional area of the second emitting portion, wherein an empty space is defined at the bottom surface of another side of the baseplate and adjacent to the second emitting portion;
   the first encapsulation layer is closely encapsulated with the top surface of the baseplate by the sealant, the first encapsulation layer covers the empty space, to be closely encapsulated with a top surface of the empty space by the sealant, the second encapsulation layer is closely encapsulated with the bottom surface of the baseplate by the sealant, the second encapsulation layer covers the empty space, to be performed adhesive encapsulation with a part of the first encapsulation layer covering on the empty space by the sealant.

4. The double-sided OLED display device according to claim 1, wherein the first display element and the second display element are both top emitting display elements and disposed back to back;
   wherein the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer comprises a first left encapsulation layer extended from upper-left side of the baseplate and a first right encapsulation layer extended from upper-right side of the baseplate, the second encapsulation layer comprises a second left encapsulation layer extended from bottom-left side of the baseplate and a second right encapsulation layer extended from bottom-right side of the baseplate;
   the first left encapsulation layer and the first right encapsulation layer adhere integrally and be closely encapsulated with the top surface of the baseplate; the second left encapsulation layer and the second right encapsulation layer adhere integrally and be closely encapsulated with the bottom surface of the baseplate.

5. The double-sided OLED display device according to claim 4, wherein the first left encapsulation layer and the first right encapsulation layer both cover the first emitting portion, vertical contact regions of the first left encapsulation layer and the first right encapsulation layer, which are located at two sides of the first emitting portion, are closely encapsulated by the sealant;
   the second left encapsulation layer and the second right encapsulation layer both cover the second emitting portion, vertical contact regions of the second left encapsulation layer and the second right encapsulation layer, which are located at two sides of the second emitting portion, are closely encapsulated by the sealant.

6. The double-sided OLED display device according to claim 5, wherein horizontal contact regions of a part of the first left encapsulation layer and the first right encapsulation layer, which are located at two sides of the first emitting portion, are closely encapsulated by the sealant;

horizontal contact regions of a part of the second left encapsulation layer and the second right encapsulation layer, which are located at two sides of the second emitting portion, are closely encapsulated by the sealant.

7. The double-sided OLED display device according to claim 4, wherein the first left encapsulation layer and the first right encapsulation layer both cover a top of the first emitting portion, contact regions of the first left encapsulation layer and the first right encapsulation layer, which are located on the top of the first emitting portion, are closely encapsulated by the sealant;

the second left encapsulation layer and the second right encapsulation layer both cover a top of the second emitting portion, contact regions of the second left encapsulation layer and the second right encapsulation layer, which are located on the top of the second emitting portion, are closely encapsulated by the sealant.

8. The double-sided OLED display device according to claim 1, wherein the first display element and the second display element are both top emitting display elements and disposed back to back;

wherein bottoms of the first baseplate and the second baseplate are adhesively fixed by an adhering layer, the first encapsulation layer and the second encapsulation layer extend from a same side of the first baseplate and the second baseplate, correspondingly;

the first encapsulation layer and the first baseplate are closely encapsulated by the sealant, the second encapsulation layer and the second baseplate are closely encapsulated by the sealant.

9. The double-sided OLED display device according to claim 1, wherein the first display element and the second display element are both bottom emitting display elements and disposed oppositely;

wherein the first encapsulation layer and the second encapsulation layer extend from a same side of the first baseplate and the second baseplate, correspondingly;

the first encapsulation layer and the first baseplate are closely encapsulated by the sealant, the second encapsulation layer and the second baseplate are closely encapsulated by the sealant, the first encapsulation layer and the second encapsulation layer are adhesively fixed by an adhering layer.

10. A double-sided organic lighting emitting diode (OLED) display device, comprising: a first display element, a second display element, a first encapsulation layer, and a second encapsulation layer, the first display element is disposed on the second display element, and the first display element and the second display element have opposite emitting directions;

the first display element comprising a first baseplate and a first emitting portion disposed on the first baseplate, the second display element comprising a second baseplate and a second emitting portion disposed on the first baseplate;

wherein the first encapsulation layer extends from one side or two sides of the first baseplate, and curvedly overlaps on the first emitting portion; the second encapsulation layer extends from one side or two sides of the second baseplate, and curvedly overlaps on the second emitting portion, the first encapsulation layer and the second encapsulation layer both be closely encapsulated with at least one of the first baseplate and the second baseplate by a sealant, respectively.

11. The double-sided OLED display device according to claim 10, wherein the first display element and the second display element are both top emitting display elements and disposed back to back;

wherein the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer and the second encapsulation layer extend from one side of the baseplate; the first encapsulation layer is closely encapsulated with the top surface of the baseplate by the sealant, the second encapsulation layer is closely encapsulated with the bottom surface of the baseplate by the sealant.

12. The double-sided OLED display device according to claim 10, wherein the first display element and the second display element are both top emitting display elements and disposed back to back;

wherein by the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer and the second encapsulation layer extend from one side of the baseplate;

a cross-sectional area of the first emitting portion is larger than a cross-sectional area of the second emitting portion, wherein an empty space is defined at the bottom surface of another side of the baseplate and adjacent to the second emitting portion;

the first encapsulation layer is closely encapsulated with the top surface of the baseplate by the sealant, the first encapsulation layer covers the empty space, to be closely encapsulated with a top surface of the empty space by the sealant, the second encapsulation layer is closely encapsulated with the bottom surface of the baseplate by the sealant, the second encapsulation layer covers the empty space, to be performed adhesive encapsulation with a part of the first encapsulation layer covering on the empty space by the sealant.

13. The double-sided OLED display device according to claim 10, wherein the first display element and the second display element are both top emitting display elements and disposed back to back;

wherein the first baseplate and the second baseplate integrally constitute a baseplate, the first emitting portion is on a top surface of the baseplate, the second emitting portion is on a bottom surface of the baseplate, the first encapsulation layer and the second encapsulation layer are separated from each other, the first encapsulation layer comprises a first left encapsulation layer extended from upper-left side of the baseplate and a first right encapsulation layer extended from upper-right side of the baseplate, the second encapsulation layer comprises a second left encapsulation layer extended from bottom-left side of the baseplate and a second right encapsulation layer extended from bottom-right side of the baseplate;

the first left encapsulation layer and the first right encapsulation layer adhere integrally and be closely encapsulated with the top surface of the baseplate; the second left encapsulation layer and the second right encapsulation layer adhere integrally and be closely encapsulated with the bottom surface of the baseplate.

14. The double-sided OLED display device according to claim 13, wherein the first left encapsulation layer and the first right encapsulation layer both cover the first emitting portion, vertical contact regions of the first left encapsulation layer and the first right encapsulation layer, which are located at two sides of the first emitting portion, are closely encapsulated by the sealant;

the second left encapsulation layer and the second right encapsulation layer both cover the second emitting portion, vertical contact regions of the second left encapsulation layer and the second right encapsulation layer, which are located at two sides of the second emitting portion, are closely encapsulated by the sealant.

15. The double-sided OLED display device according to claim 14, wherein horizontal contact regions of a part of the first left encapsulation layer and the first right encapsulation layer, which are located at two sides of the first emitting portion, are closely encapsulated by the sealant;

horizontal contact regions of a part of the second left encapsulation layer and the second right encapsulation layer, which are located at two sides of the second emitting portion, are closely encapsulated by the sealant.

16. The double-sided OLED display device according to claim 13, wherein the first left encapsulation layer and the first right encapsulation layer both cover a top of the first emitting portion, contact regions of the first left encapsulation layer and the first right encapsulation layer, which are located on the top of the first emitting portion, are closely encapsulated by the sealant;

the second left encapsulation layer and the second right encapsulation layer both cover a top of the second emitting portion, contact regions of the second left encapsulation layer and the second right encapsulation layer, which are located on the top of the second emitting portion, are closely encapsulated by the sealant.

17. The double-sided OLED display device according to claim 10, wherein the first display element and the second display element are both top emitting display elements and disposed back to back;

wherein bottoms of the first baseplate and the second baseplate are adhesively fixed by an adhering layer, the first encapsulation layer and the second encapsulation layer extend from a same side of the first baseplate and the second baseplate, correspondingly;

the first encapsulation layer and the first baseplate are closely encapsulated by the sealant, the second encapsulation layer and the second baseplate are closely encapsulated by the sealant.

18. The double-sided OLED display device according to claim 10, wherein the first display element and the second display element are both bottom emitting display elements and disposed oppositely;

wherein the first encapsulation layer and the second encapsulation layer extend from a same side of the first baseplate and the second baseplate, correspondingly;

the first encapsulation layer and the first baseplate are closely encapsulated by the sealant, the second encapsulation layer and the second baseplate are closely encapsulated by the sealant, the first encapsulation layer and the second encapsulation layer are adhesively fixed by an adhering layer.

19. The double-sided OLED display device according to claim 10, wherein outer surfaces of the first emitting portion and the second emitting portion, are completely covered with a thin-film encapsulation layer.

* * * * *